United States Patent [19]
Tanaka

[11] Patent Number: 5,920,465
[45] Date of Patent: Jul. 6, 1999

[54] CONNECTING STRUCTURE BETWEEN FLEXIBLE PRINTED CIRCUIT BOARD AND HARD PRINTED CIRCUIT BOARD

[75] Inventor: Kazuhisa Tanaka, Ohmiya, Japan

[73] Assignee: Fuji Photo Optical Co. Ltd., Saitama-ken, Japan

[21] Appl. No.: 09/002,531

[22] Filed: Jan. 2, 1998

[30] Foreign Application Priority Data

Jan. 17, 1997 [JP] Japan .................................... 9-017695

[51] Int. Cl.6 .................................................. H05K 1/14
[52] U.S. Cl. .......................... 361/784; 361/749; 361/803; 439/67
[58] Field of Search ............................... 439/65, 67, 493, 439/77; 361/749, 750, 784, 785, 786, 789, 803; 174/254, 268

[56] References Cited

U.S. PATENT DOCUMENTS

| | | | |
|---|---|---|---|
| 3,602,870 | 8/1971 | Willard | 439/67 |
| 4,784,615 | 11/1988 | Teng-Hong | 439/67 |
| 5,110,298 | 5/1992 | Dorinski et al. | 439/65 |
| 5,219,292 | 6/1993 | Dickirson et al. | 439/67 |
| 5,244,395 | 9/1993 | DeSantis et al. | 439/67 |
| 5,263,868 | 11/1993 | Renn et al. | 439/67 |
| 5,383,788 | 1/1995 | Spencer | 439/67 |
| 5,403,202 | 4/1995 | Roehling | 439/493 |
| 5,418,691 | 5/1995 | Tokura | 439/67 |
| 5,455,742 | 10/1995 | Phoy et al. | 439/65 |
| 5,702,269 | 12/1997 | Uchida et al. | 439/67 |
| 5,754,411 | 5/1998 | Woychik | 439/65 |
| 5,777,855 | 7/1998 | Yokajity | 439/67 |

*Primary Examiner*—Leo P. Picard
*Assistant Examiner*—John B. Vigushin
*Attorney, Agent, or Firm*—Price, Heneveld, Cooper, DeWitt & Litton

[57] ABSTRACT

A connecting structure for interconnection of a flexible printed circuit board (FPC) and a hard printed circuit board (PCB) allowing the FPC and the PCB to be easily connected to each other at a predetermined relative position by fitting a male joint of the FPC into a female joint of the PCB even when a supporting member, such as a casing, is not available immediately below portions of the PCB and FPC to be connected to each other. In the connecting structure for interconnection of an FPC and a PCB according to a specific embodiment of the invention, a surface of the FPC opposed to the PCB is provided with a male joint in the form of a protruding plate, and a surface of the PCB opposed to the FPC is provided with a female joint in the form of an opening or a recess adapted to receive the protruding plate and thereby to position the FPC at a predetermined location of the PCB.

15 Claims, 5 Drawing Sheets

CONNECTING STRUCTURE BETWEEN FLEXIBLE PRINTED CIRCUIT BOARD AND HARD PRINTED CIRCUIT BOARD

BACKGROUND OF THE INVENTION

This invention relates to a connecting structure for connecting a flexible printed circuit board to a hard printed circuit board by placing the former upon the latter and then by soldering connector terminals of these printed circuit boards together, and more particularly to such a connecting structure adapted to position the flexible printed circuit board relative to the hard printed circuit board while the printed circuit boards are connected to each other.

When a flexible printed circuit board (referred to hereinafter simply as "FPC") is placed upon and soldered to a hard printed circuit board (referred to hereinafter simply as "PCB"), connection terminals of the respective printed circuit boards to be soldered together must be properly positioned relative to each other. Such positioning has conventionally been achieved, as shown in FIG. 7 of the accompanying drawings, in a manner as follows. A supporting member 2 partially utilizing any one of casings for various devices or any one of structure components to support a PCB 1 from its rear side is provided with a pin 3. The pin 3 is inserted into through-holes 1a, 4a formed through the PCB 1 and an FPC 4, respectively, and aligned with each other so as to position these printed circuit boards 1, 4 relative to each other.

In an alternative manner of positioning, the supporting member 2 has been formed with a threaded hole, instead of providing the pin 3, so that a set screw may be inserted into the through-holes 1a, 4a of the respective printed circuit boards 1, 4 until the set screw is threaded into the threaded hole and thereby the FPC 4 has been positioned relative to the PCB 1.

In a further alternative manner of positioning, side edges of the respective printed circuit boards have been put against the pin 3 to position these two printed circuit boards relative to each other, instead of forming the PCB 1 and the FPC 4 with the through-holes.

After the PCB 1 and the FPC 4 have been relatively positioned in the manner as described above, the connector terminals of the respective printed circuit boards 1, 4 are soldered together. It should be understood that reference numeral 5 in FIG. 7 designates a soldered spot.

However, the connecting structure of well-known art selectively adopting the manners of positioning as have been described above is disadvantageously accompanied with problems depending on the adopted manners of positioning. When the relatively small-sized, band-shaped FPC 4 is formed with the positioning through-hole 4a, the FPC 4 is provided along its transversely opposite side with protrusions 4c, 4c, respectively, and these protrusions 4c, 4c must be formed with through-holes 4a, 4a as shown in FIG. 8. Consequently, when a plurality of FPCs 4 are arranged in parallel one to another, the protrusions 4c, 4c are interposed between each pair of adjacent FPCs 4. Such arrangement inevitably enlarges a space occupied by these FPCs 4 and the device equipped with these FPCs 4 should become correspondingly bulky as a whole.

When it is desired to modify the location at which the PCB 1 and the FPC 4 are to be connected to each other, the location of the pin 3 or the threaded hole on the supporting member 2 must also be modified. Such modification makes the operation of modifying the positioning reference complex.

Further, as seen in FIG. 9, there may be a situation in which an actuator, such as an electric motor 6, and various electronic components are arranged immediately below the portions of the PCB 1 and the FPC 4 to be connected to each other and, as a result, the supporting member in the form of a casing is unavailable. In this case, it is impossible to provide the casing 7 with the pin 3 or the threaded hole and the operation of positioning the FPC 4 becomes difficult.

SUMMARY OF THE INVENTION

In view of the problem as has been described above, it is a principal object of the invention to provide a connecting structure between a flexible printed circuit board and a hard printed circuit board so improved that, even when no supporting member in the form of a casing or the like is available immediately below the portions of the PCB and FPC to be connected to each other, the FPC and the PCB can be easily positioned relative to each other as the PCB and the FPC are connected to each other.

The object set forth above is achieved, according to the invention, by a connecting structure for connecting a flexible printed circuit board to a hard printed circuit board by placing them so that the flexible printed circuit board overlaps the hard printed circuit board at a predetermined location thereof and then soldering these two printed circuit boards together, wherein a surface of the flexible printed circuit board that is opposed to the hard printed circuit board is provided with a male joint, and a surface of the hard printed circuit board that is opposed to the flexible printed circuit board is provided with a female joint adapted to receive the male joint and thereby to position the flexible printed circuit board at the predetermined location of the hard printed circuit board. Accordingly, the FPC and the PCB and be relatively positioned merely by fitting the male joint of the FPC into the female joint of the PCB.

The male joint and the female joint are substantially identical in shape as well as size and are configured so that the flexible printed circuit board and the hard printed circuit board cannot be rotated relative to each other. Accordingly, the male and female joints can neither relatively move nor relatively rotate once the male joint has been fitted into the female joint, and thereby a desired relative positioning has been achieved.

In order to assure that the male joint and the female joint cannot relatively rotate, these two joints are preferably rectangular or polygonal. In a preferred embodiment, therefore, both the male joint and the female joint are rectangular or polygonal. Preferably, the male joint has a substantially same width as a width of the flexible printed circuit board.

With such dimensioning as mentioned above, a protruding plate continuously extending across the respective FPCs may be bonded to a large-sized print sheet before the respective FPCs are cut out from the print sheet, and the respective FPCs may be cut out from the print sheet together with the respective individual protruding plates.

It is also possible to provide the female joint in the form of a through-hole or a groove. The female joint is not limited to the through-hole or the groove formed in a part of the PCB and, from the viewpoint of workability, it is also possible to provide the female joint in the form of a notch cut out from an end of the hard printed circuit board so far as the female joint can receive the male joint. It is also possible to provide a plurality of male joints and a plurality of female joints instead of the single pair of male and female joints.

These and other features, objects, and advantages of the present invention will become apparent upon reading the following description thereof, together with reference to the accompanying drawings.

BRIEF DESCRIPTION OF THE DRAWINGS

In the drawings:

FIG. 2 is a diagram illustrating the flexible printed circuit board, in which FIG. 2(a) is a plan view and FIG. 2(b) is a sectional view taken longitudinally of the board;

DETAILED DESCRIPTION OF THE PREFERRED EMBODIMENTS

Details of the inventive connecting structure between the flexible printed circuit board and the hard printed circuit board will be more fully understood from the description given hereunder with reference to specific embodiments as illustrated in the accompanying drawings.

Figure 1:
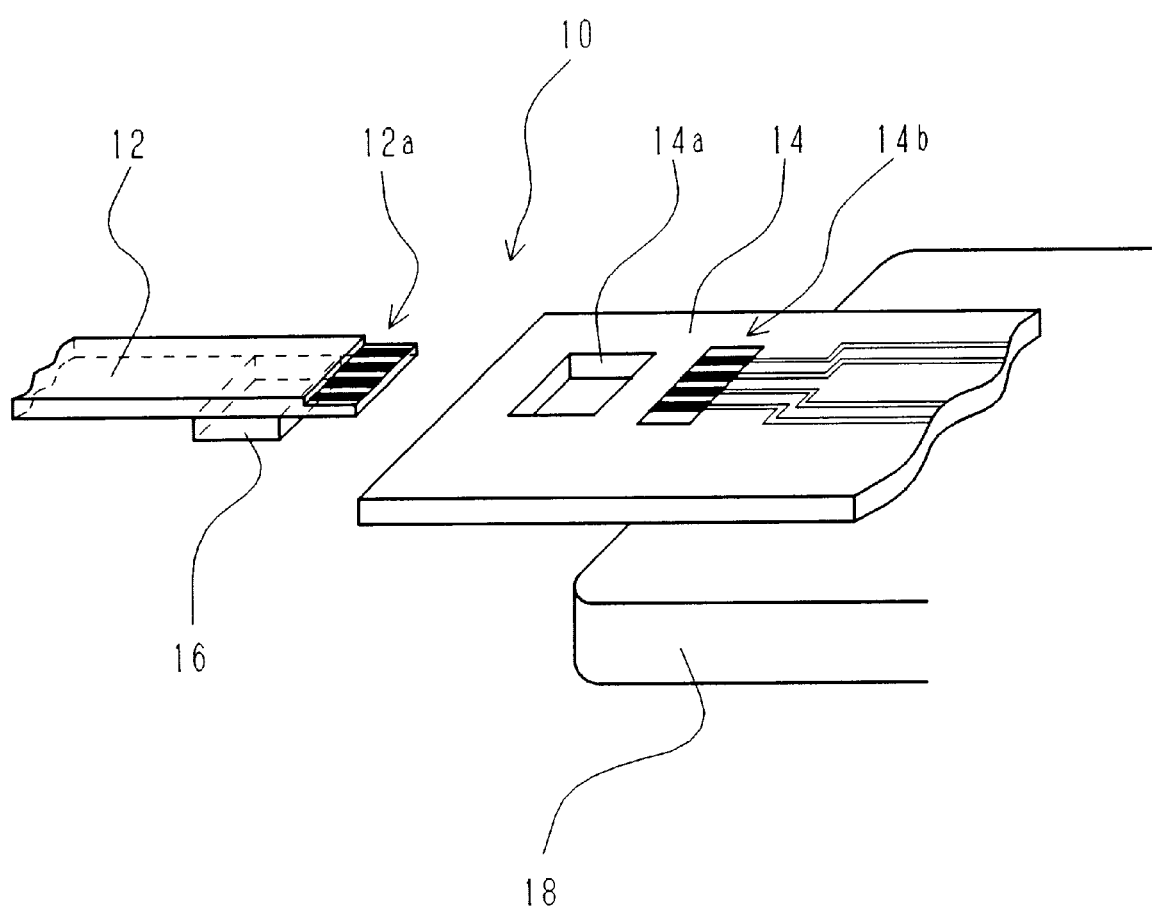
FIG. 1 is an exploded perspective view showing an embodiment of the inventive connecting structure between a flexible printed circuit board and a hard printed circuit board.

Referring to FIG. 1, the connecting structure 10 generally comprises FPC 12 and PCB 14. The FPC 12 is provided on its surface opposed to the PCB 14 with a male joint in the form of a protruding plate 16, and the PCB 14 is provided in its surface opposed to the FPC 12 with a female joint in the form of an opening 14a adapted to receive the protruding plate 16, and thereby to position the FPC 12 relative to the PCB 14. The PCB 14 is supported by any one of casings for various devices and/or various components used as a supporting member 18.

Figure 2:
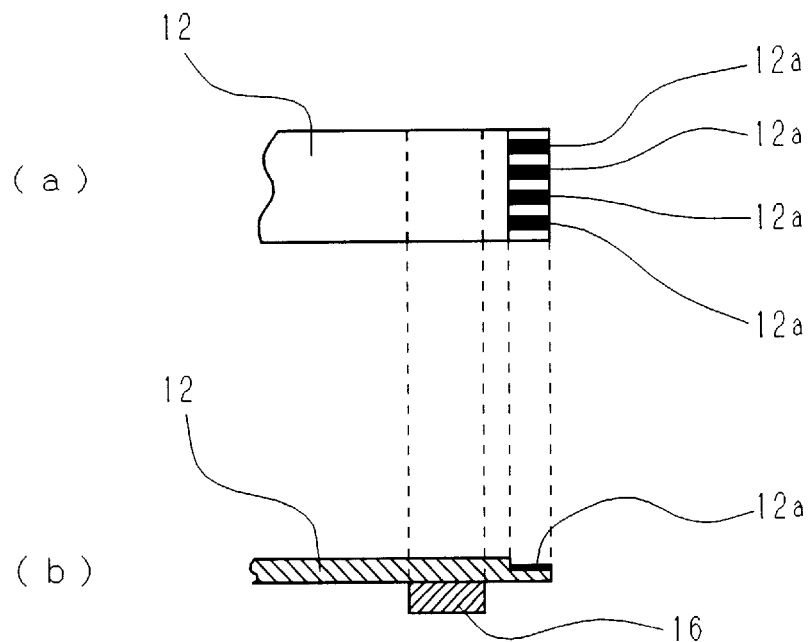

As will be apparent from FIGS. 1 and 2, an end portion of the FPC 12 to be connected to the PCB 14 has a band-like shape of a substantially uniform width. The protruding plate 16 is bonded to the FPC 12 on a surface of the end portion opposed to its surface on which connector terminals 12a are exposed. The location at which the protruding plate 16 is bonded to the FPC 12 makes a part of the area over which the FPC 12 overlaps the PCB 14. The protruding plate 16 is substantially rectangular and has a substantially same width as a width of the FPC 12. A thickness of the protruding plate 16 is dimensioned so as to prevent the protruding plate 16 from readily sliding and/or falling off with respect to the PCB 14 once the protruding plate 16 has been received by the opening 14a of the PCB 14. It should be understood that the protruding plate 16 is bonded to the FPC 12 in a well-known manner, for example, by bonding them together utilizing adhesive.

Figure 3:
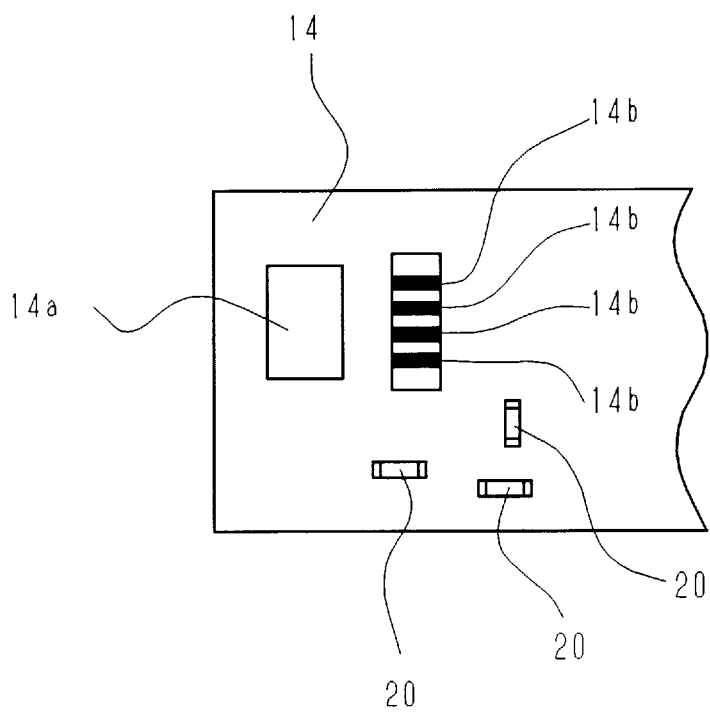
FIG. 3 is a plan view showing a hard printed circuit board.
Figure 4:
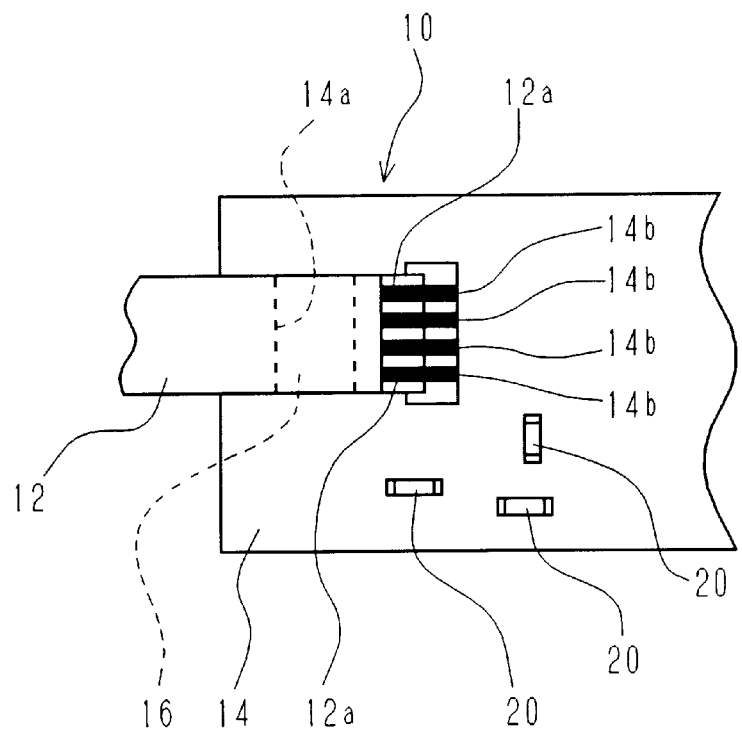
FIG. 4 is a plan view illustrating a manner in which the flexible printed circuit board and the hard printed circuit board are connected together.

Referring to FIGS. 1 and 3, the opening 14a formed in the PCB 14 comprises a through-hole which is substantially identical in shape and size to the protruding plate 16 bonded to the FPC 12. The location at which the opening 14a is formed in the PCB 14 is selected so as to oppose the protruding plate 16 when the connector terminals 12a of the FPC 12 are soldered to corresponding connector terminals 14b of the PCB 14. Reference numeral 20 in FIGS. 3 and 4 designates an appropriate electronic component.

To connect FPC 12 to the PCB 14, the protruding plate 16 of the FPC 12 may be fitted into the opening 14a of the PCB 14. Thereupon, the connector terminals 12a of the FPC 12 and the connector terminals 14b of the PCB 14 are relatively positioned. From this state, the connector terminals 12a, 14b may be soldered together to achieve an interconnection between the FPC 12 and the PCB 14.

According to the embodiment as has been described just above, the protruding plate 16 may be fitted into the opening 14a to fix the FPC 12 relative to the PCB 14 without any apprehension that the FPC 12 might slip or rotate relative to the PCB 14, and thereby to position them relative to each other, since the protruding plate 16 and the opening 14a, both being rectangularly shaped, are substantially identical to each other in shape as well as size.

Figure 5:
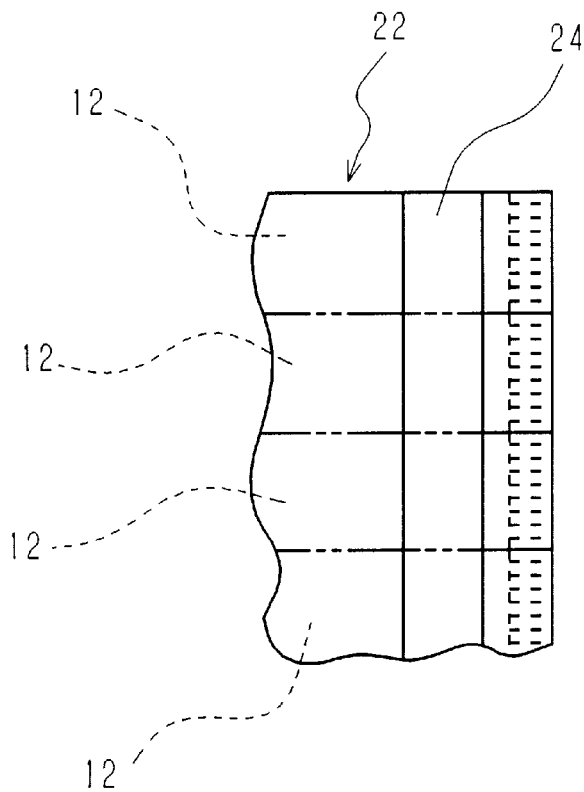
FIG. 5 is a bottom view showing a print sheet before the flexible printed circuit board is cut out therefrom.

The feature of this embodiment, such that the protruding plate 16 has the substantially same width as that of the band-like FPC 12, allows a protruding plate 24 continuously extending across a plurality of FPCs 12 to be previously bonded to a single large print sheet 22 as shown by FIG. 5 before the respective FPCs 12 are cut out from this print sheet 22. In this manner, troublesome operation of bonding the protruding plates 16 individually to the respective FPCs 12 can be avoided and steps of manufacturing can be correspondingly simplified.

While the invention has been described above as for the case in which the protruding plate 16 and the opening 14a, both being rectangular shapes, are substantially identical to each other in shape and size, the shape of these two components is not limited to the rectangular shape so far as these two components can be accurately and reliably positioned relative to each other. For example, both the protruding plate and the opening may be shaped in a polygon, such as a triangle or a square, or even in oval so long as they are substantially identical in shape and size.

It is also possible to provide a single set of FPC and PCB with plural sets of protruding plates and openings, respectively. With such arrangement, no relative rotation of the FPC and PCB occurs even if the respective sets of protruding plates and openings are circular.

It is not essential that the opening 14 and the protruding plate 16 are substantially identical in shape, so far as the opening is appropriately shaped to assure the desired positioning of the protruding plate 16. Specifically, it is important that the opening 14a can serve a positioning reference for the protruding plate 16. More specifically, it suffices that the opening includes at least elements serving as the reference, such as sides or angular corners.

For example, the protruding plate 16 may have a square shape, while the opening 14a may have a shape which can hold only a pair of obliquely opposite angles and not contact the remaining portions of the protruding plate 16. In this case, the protruding plate 16 is engaged with the opening 14a at a predetermined position relative to the opening 14a and thereby the FPC 12 is properly positioned relative to the PCB 14.

Figure 6:
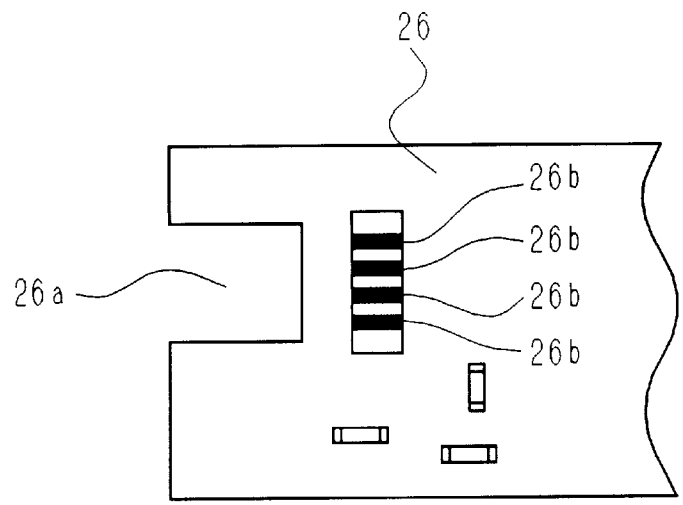
FIG. 6 is a plan view showing another embodiment of the hard printed circuit board.
Figure 7:
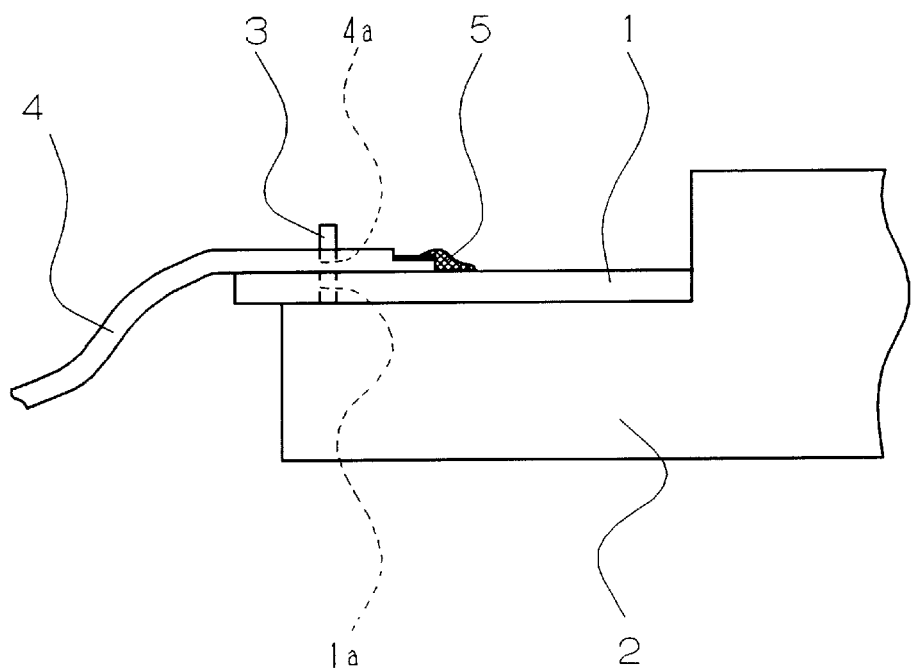
FIG. 7 is a side view showing the conventional connector structure between the flexible printed circuit board and the hard printed circuit board.
Figure 8:
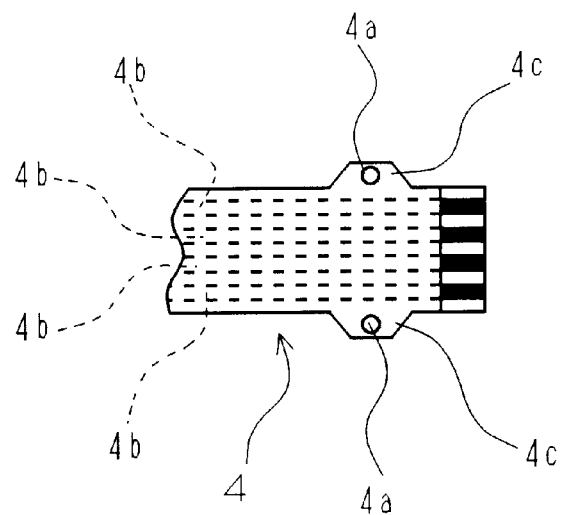
FIG. 8 is a plan view showing an example of the conventional flexible printed circuit board.
Figure 9:
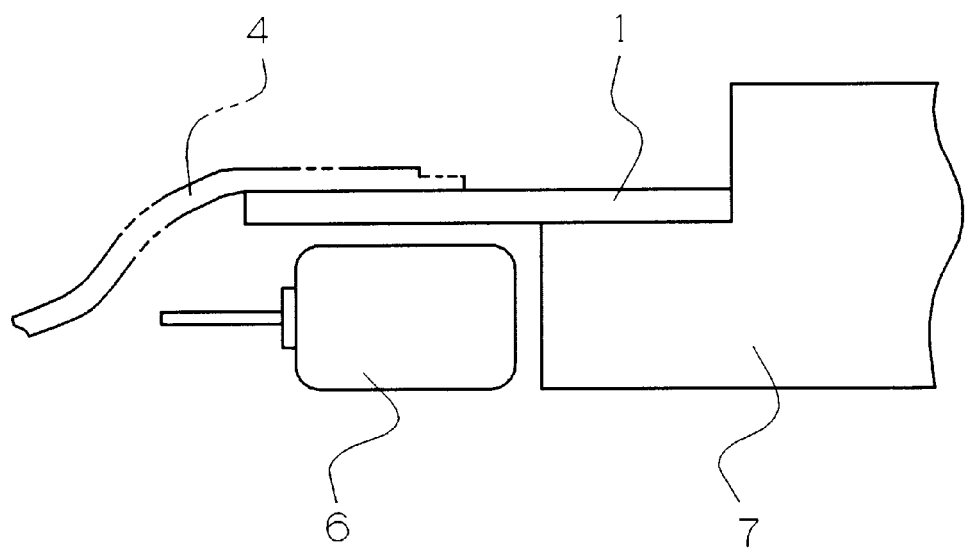
FIG. 9 is a side view showing an example of a conventional hard printed circuit board supporting member.

Alternatively, transversely opposite sides of the rectangular opening 14a formed in the PCB 14 and extending in parallel to the longitudinal direction of the FPC 12, as shown by FIGS. 1 through 4, may be prolonged in the direction opposite to the connector terminals 26b so as to form a female joint in the form of a notch 26a cut out from a forward edge of a PCB 26, as shown by FIG. 6. In this case, the protruding plate 16 of the FPC 12 may be pressed into the notch 26a toward the connector terminals 26b to achieve the desired positioning of the protruding plate 16.

While the specific embodiment has been illustrated and described above as the protruding plate 16 being bonded to the FPC 12 as the male joint, the invention is not limited to such embodiment and, instead of the protruding plate 16, other members, such as joint pins, may be bonded to the FPC 12 as the male joint. Furthermore, the opening 14a of the PCB 14 may be provided in the form of a recess rather than the through-hole.

As has been described hereinabove, the inventive connecting structure between the flexible printed circuit board (FPC) and the hard printed circuit board (PCB) generally comprises the male joint provided on the surface of the FPC opposed to the PCB and the female joint provided in or through the surface of the PCB opposed to the FPC so that the male joint can be fitted into the female joint, and thereby the FPC can be accurately positioned relative to the PCB. With such arrangement, the desired relative positioning of the FPC and the PCB can be achieved merely by fitting the male joint provided on the FPC into the female joint provided in or through the PCB.

In this way, the relative positioning of the FPC and the PCB can be achieved merely by fitting the male joint into the female joint without providing the FPC with any additional holes for this purpose. Accordingly, it is avoided that the shape of the FPC might inconveniently depend on such holes used exclusively for the positioning purpose even in the case of an FPC having a close-packed wiring pattern.

The FPC is positioned relative to the PCB merely by fitting the male joint into the female joint without a demand for providing the supporting member, such as the casing on which the PCB is supported, with pins or threaded holes. As a consequence, operation of mounting the pins or operation of forming the threaded holes can be eliminated.

Moreover, the FPC can be positioned relative to the PCB even when there is no supporting member, such as the casing on which the PCB is usually supported. This feature advantageously simplifies operation of connecting the FPC to the PCB.

In addition, the invention allows the relative position of the FPC and the PCB when they are connected to each other to be easily modified merely by modifying the location at which the FPC is provided with the male joint or the location at which the PCB is formed with the female joint.

It will become apparent to those skilled in the art that various modifications to the preferred embodiment of the present invention can be made without departing from the spirit and scope thereof as defined by the appended claims.

The embodiments of the invention in which an exclusive property or privilege is claimed are defined as follows:

1. A connecting structure for connecting a flexible printed circuit board to a hard printed circuit board by placing them so that said flexible printed circuit board overlaps said hard printed circuit board at a predetermined location thereof and then by soldering these two printed circuit boards together, said connecting structure comprising:
   a male joint provided on a surface of said flexible printed circuit board opposed to said hard printed circuit board, wherein said male joint has a substantially same width as a width of said flexible printed circuit board; and
   a female joint provided on a surface of said hard printed circuit board opposed to said flexible printed circuit board, said female joint adapted to receive said male joint and thereby to position said flexible printed circuit board at said predetermined location of said hard printed circuit board.

2. The connecting structure as defined in claim 1, wherein said male joint and said female joint are substantially identical to each other in shape and size and said flexible printed circuit board and said hard printed circuit board are configured so that one cannot be rotated relative to the other.

3. The connecting structure as defined in claim 2, wherein both of said male joint and said female joint are rectangular.

4. The connecting structure as defined in claim 2, wherein both said male joint and said female joint are polygonal.

5. The connecting structure as defined in claim 1, wherein said female joint is provided in the form of a through-hole.

6. The connecting structure as defined in claim 1, wherein said female joint is provided in the form of a groove.

7. The connecting structure as defined in claim 1, wherein said female joint is provided in the form of a notch cut out from an end of said hard printed circuit board.

8. The connecting structure as defined in claim 1, wherein there are provided a plurality of said male joints and a plurality of said female joints.

9. The connecting structure as defined in claim 1, wherein said male joint comprises a protruding plate bonded to said surface of said flexible printed circuit board.

10. The connecting structure as defined in claim 1, wherein said flexible printed circuit board is substantially parallel to said hard printed circuit board at said predetermined location.

11. A circuit board connecting structure, comprising:
    a hard printed circuit board;
    a flexible printed circuit board overlapping said hard printed circuit board at a predetermined location, said flexible printed circuit board and hard printed circuit board soldered together;
    a male joint provided on a surface of said flexible printed circuit board opposed to said hard printed circuit board, said male joint having a substantially same width as a width of said flexible printed circuit board; and
    a female joint provided on a surface of said hard printed circuit board opposed to said flexible printed circuit board, said female joint adapted to receive said male joint and thereby to position said flexible printed circuit board at said predetermined location of said hard printed circuit board.

12. The connecting structure as defined in claim 11, wherein said male joint and said female joint are substantially identical to each other in shape and size and said flexible printed circuit board and said hard printed circuit board are configured so that one cannot be rotated relative to the other.

13. The connecting structure as defined in claim 11, wherein said male joint comprises a protruding plate bonded to said surface of said flexible printed circuit board.

14. The connecting structure as defined in claim 11, wherein said flexible printed circuit board is substantially parallel to said hard printed circuit board at said predetermined location.

15. A circuit board connecting structure comprising:
    a hard printed circuit board;
    a flexible printed circuit board overlapping said hard printed circuit board at a predetermined location and arranged substantially parallel to said hard printed circuit board at said predetermined location, said flexible printed circuit board and hard printed circuit board having electrical circuits connected together;

a male joint having a protruding member bonded on a surface of said flexible printed circuit board opposed to said hard printed circuit board, said male joint having a substantially same width as a width of said flexible printed circuit board; and a female joint provided on a surface of said hard printed circuit board opposed to said flexible printed circuit board, said female joint adapted to receive said male joint and thereby to position said flexible printed circuit board at said predetermined location of said hard printed circuit board.

* * * * *